United States Patent [19]

Takemae et al.

[11] Patent Number: 4,636,982

[45] Date of Patent: Jan. 13, 1987

[54] SEMICONDUCTOR MEMORY DEVICE

[75] Inventors: Yoshihiro Takemae, Tokyo; Tomio Nakano, Kawasaki; Kimiaki Sato, Tokyo, all of Japan

[73] Assignee: Fujitsu Limited, Kawasaki, Japan

[21] Appl. No.: 729,200

[22] Filed: May 1, 1985

[30] Foreign Application Priority Data

May 4, 1984 [JP] Japan .................................. 59-88331

[51] Int. Cl.⁴ .......................... G11C 7/00; G11C 11/24
[52] U.S. Cl. ...................................... 365/149; 365/230
[58] Field of Search .......................... 365/149, 189, 230

[56] References Cited

U.S. PATENT DOCUMENTS 4,520,465  5/1985  Sood .................................... 365/230
4,569,036  2/1986  Fujii et al. ........................... 365/230

Primary Examiner—James W. Moffitt
Attorney, Agent, or Firm—Staas & Halsey

[57] ABSTRACT

A semiconductor memory device including at least two groups, each of said groups including a plurality of memory cell array blocks. The number of the memory cell array blocks which are activated in one group is made different from the number of memory cell array blocks which are activated in another group by providing a sequential circuit, thus reducing the maximum power consumption.

13 Claims, 15 Drawing Figures

Fig. 6A
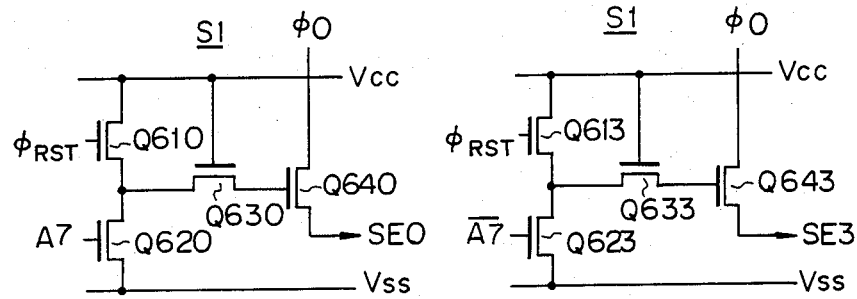
Fig. 6D
Fig. 6B
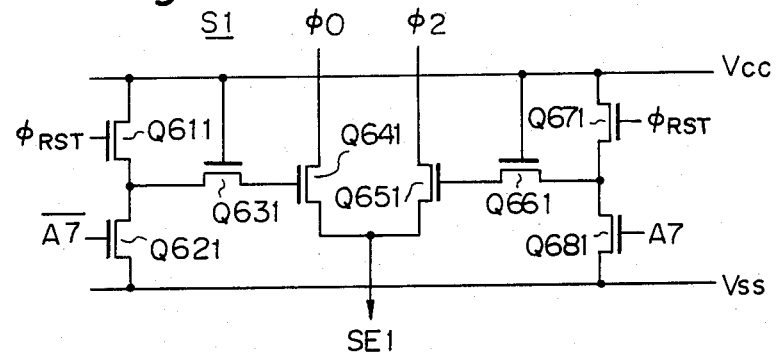
Fig. 6C
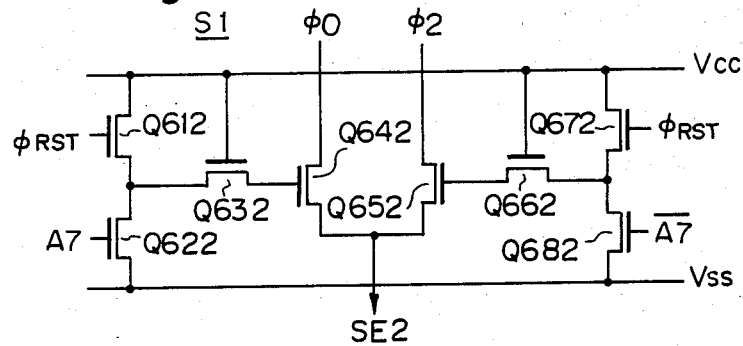

SEMICONDUCTOR MEMORY DEVICE

BACKGROUND OF THE INVENTION

The present invention relates to a semiconductor memory device, more particularly to a single-transistor single-capacitor dynamic random-access memory (DRAM) with bit lines split into a plurality of blocks and with an improved capacitance ratio between the capacitance of the memory cells to the bit line capacitance, wherein the number of blocks in which charging and discharging of the bit lines are performed is minimized and the maximum power consumption is reduced.

In general, in a DRAM using memory cells each composed of a single capacitor and a single transistor, the smaller the capacitance ratio of the capacitance of the bit lines with respect to the capacitance of the memory cells, the larger the change in the bit line potential upon reading of data and, thus, the more reliable the reading of memory data and the more dependable the memory device. However, in recent years, semiconductor memory devices have been made increasingly greater in density and the individual memory cells have become smaller in size, resulting in smaller capacitances of the memories. On the other hand, the number of memory cells connected to each bit line has increased and the bit lines have become longer in length, resulting in a greater increase in the capacitances of the bit lines. For this reason, the increase in memory capacities has led to a disadvantageously large ratio between the capacitance of the memory cells and the bit line capacitance and thus a reduction in dependability.

To prevent such problems, there has previously been proposed, in Japanese Kokai No. 59-101093 of the present assignee, a DRAM wherein bit lines are split into a plurality of blocks and the bit lines are sequentially driven by each block so as to reduce the bit line capacitance during readout and thereby ensure reliable reading of memory data. Such a DRAM having split blocks of bit lines is also disclosed in FIG. 7 of U.S. Pat. No. 4,122,546 of Paul-Werner von Basse, assigned to Siemens.

On the other hand, from the viewpoint of improving the mounting density, which is limited by heat radiation characteristics during mounting of the DRAM, and of reducing the capacitance of the power supply circuit, it is desirable to reduce the maximum power consumption of the DRAM as much as possible.

In a DRAM considered before the present invention, having such split blocks of bit lines as described above, the maximum power consumption is large, as is described below in more detail with reference to the attached drawings.

SUMMARY OF THE INVENTION

The object of the present invention, in view of the above-mentioned problems in the prior art, is to provide a semiconductor memory device with bit lines split into a plurality of blocks and an improved capacitance ratio between the capacitance of the memory cells and the bit line capacitance, wherein the number of blocks in which charging or discharging of the bit lines is performed is averaged, regardless of the address, so as to reduce the maximum power consumption.

To achieve the above-mentioned object, the present invention provides a semiconductor memory device including: at least two groups each including a plurality of memory cell array blocks, wherein each of the memory cell array blocks has a plurality of bit line pairs, a plurality of word lines, and a plurality of memory cells each being connected between one of the bit lines comprising the bit line pairs and one of the word lines; switching means connected between bit line pairs included in two adjoining blocks of the plurality of memory cell array blocks for splitting or connecting the two adjoining blocks; a column decoder operatively connected to the bit line pairs for selecting a bit line pair to read data from a selected memory cell in one of the groups; a word decoder for simultaneously selecting a word line in one of the memory cell array blocks of one group and a word line in one of the memory cell array blocks in the other group and for selecting the word lines in such a way that the distance between the column decoder and the memory cell array block including the selected word line of the one group is different from the distance between the column decoder and the memory cell array block including the selected word line of the other group; and a switching control circuit for controlling the switching means so as to selectively drive the bit line pairs included in the memory cell array block including the selected word line and in another memory cell array block located between the memory cell array block including the selected word line and the column decoder.

BRIEF DESCRIPTION OF THE DRAWINGS

The above object and features of the present invention will be more apparent from the following description of the preferred embodiments with reference to the drawings, wherein:

FIGS. 6A and 6D are circuit diagrams for illustrating one example of the ¾ selection and operation sequential circuit in the circuit of FIG. 2;

DESCRIPTION OF THE PREFERRED EMBODIMENTS

Before describing the embodiments of the present invention, a DRAM with split bit lines considered before the present invention and a problem therein will first be described with reference to FIG. 1.

Figure 1:
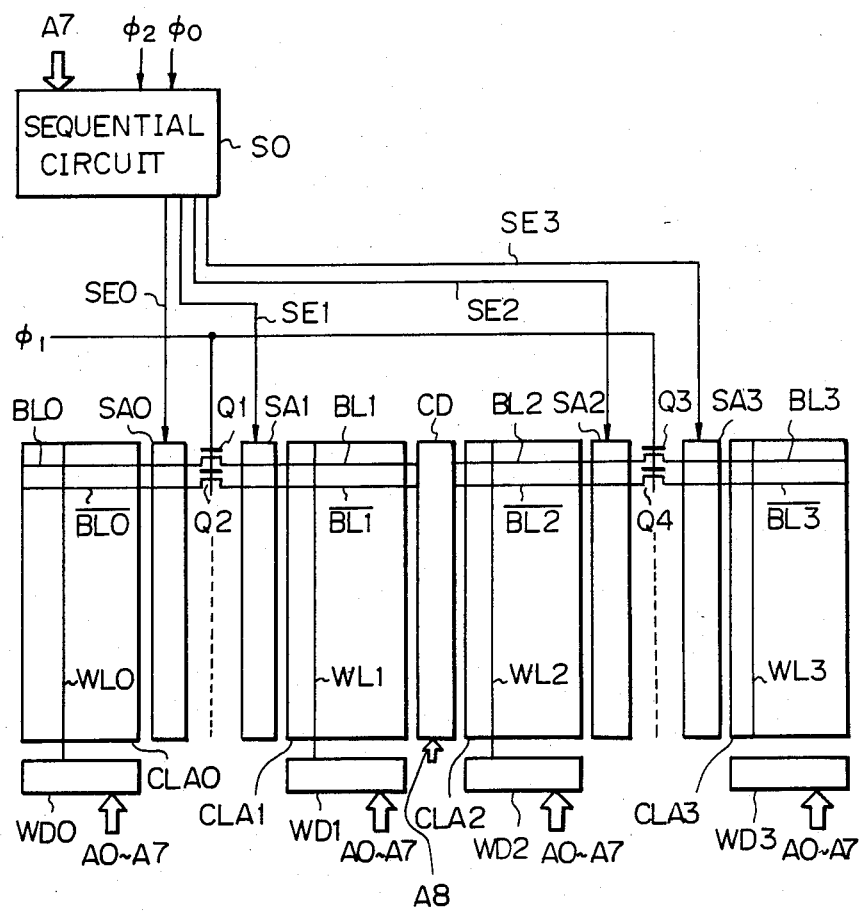
FIG. 1 is a block diagram of a DRAM previously considered before the present invention.

FIG. 1 is a block circuit diagram of a 256K-bit DRAM which was previously considered before the present invention. In the figure, the DRAM has a column decoder CD. The column decoder CD has deployed respectively to its left and right two memory cell array blocks CLA0, CLA1 and CLA2, CLA3. WD0 to WD3 are word decoders which select one of the 256 word lines WL0, . . . and WL1, . . . in the left side memory cell array blocks CLA0 and CLA1 and simultaneously select one of the 256 word lines WL2, . . . and WL3, . . . in the right side memory cell array blocks CLA2 and CLA3 by the input address signals A0 to A7. The input address signals A0 to A7 are generated inside the device in accordance with the external address signals a0 to a7 applied to the external address input terminals and latched into the device at the falling edge of the address strobe signal as is well known in the art. SA0 to SA3 are sense amplifiers for sensing and amplifying the potential difference of the corresponding bit line pairs (BL0, $\overline{BL0}$), (BL1, $\overline{BL1}$), (BL2, $\overline{BL2}$), and (BL3, $\overline{BL3}$) in the memory cell array blocks CLA0, CLA1, CLA2, and CLA3. The bit line pairs (BL0, $\overline{BL0}$) and (BL1, $\overline{BL1}$) are split by the transfer gate transistors Q1 and Q2, which are turned on in response to a clock signal $\phi1$. In the same way, the bit line pairs (BL2, $\overline{BL2}$) and (BL3, $\overline{BL3}$) are split by the transfer gate transistors Q3 and Q4, which are turned on in response to the clock signals $\phi1$. S0 is a sequential circuit for activating the sense amplifiers SA0 to SA3. Based on the clock signals $\phi0$ and $\phi2$ and the second most significant bit A7 of the row input address signal, one of the sense amplifier enable signals SE0 and SE1 and one of the sense amplifier enable signals SE2 and SE3 are selected. There are 512 bit line pairs in each memory cell array block.

When, for example, the word decoders WD0 and WD3 are driven by the row input address signals A0 to A7, a word line WL0 and a word line WL3 in the memory cell array blocks CLA0 and CLA3 are selected. In this case, the memory operation results in a difference in potential between the bit line pairs (BL0, $\overline{BL0}$) and (BL3, $\overline{BL3}$). The sequential circuit S0 raises the sense amplifier enable signals SE0 and SE3 in accordance with the rise of the clock signal $\phi0$ and the input address signal A7, whereby the sense amplifiers SA0 and SA3 operate and the potential difference between the bit lines (BL0, $\overline{BL0}$) and (BL3, $\overline{BL3}$) are amplified. Next, in accordance with the rise in the clock signal $\phi1$, the transfer gate transistors Q1 to Q4 are turned on and the above-mentioned amplified potential differences between the bit lines are transferred to the bit line pairs (BL1, $\overline{BL1}$) and (BL2, $\overline{BL2}$). Next, in accordance with the rise in the clock signal $\phi2$, the sense amplifier enable signals SE1 and SE2 rise, whereby the sense amplifiers SA1 and SA2 operate and the potential difference between the bit lines BL1, $\overline{BL1}$ and bit lines BL2, $\overline{BL2}$ are amplified and passed to the column decoder.

The column decoder CD first selects one of the bit line pairs BL1, $\overline{BL1}$ and BL2, $\overline{BL2}$ by the most significant bit signal A8 of the row input address signals. In other words, the most significant bit signals A8, $\overline{A8}$ are used to select the bit line pair to the left or right of the column decoder CD. Further, a 9-bit column address signal is used for selection of one or a plurality of pairs of the 512 bit line pairs and control of an I/O gate (not shown) for output of the potential difference to the data bus (not shown) deployed along the column.

Here, in the column decoder CD, if just the data in the cells were to be read, there would be no need to operate one of the cell arrays CLA0, CLA1 or CLA2, CLA3 on the side not selected by the most significant bit A8 of the row input address signals. However, a DRAM requires refreshing of the cell data. This refreshing is performed by selecting a word line to transfer the stored charge of the cells along the word line into the bit lines, amplifying them by the sense amplifiers, and rewriting the amplified bit line potentials into the cells along the word line at one time. Since this operation is substantially identical to the normal read operation, the control circuit for the read operation is commonly used for the refreshing.

By operating all cell arrays on both sides of the column decoder CD, the number of cells refreshed each time can be doubled and the busy ratio of the DRAM (the rate of time for the memory refresh operation, during which the memory cannot be accessed, to a certain fixed time) can be halved in comparison with the case where only one side of the column decoder CD is operated. For this reason, in the DRAM shown in FIG. 1, it is necessary to operate both cell arrays.

In this way, even when selecting the outer two memory cell array blocks CLA0 and CLA3, the bit lines in the inner two memory cell array blocks CLA1 and CLA2 must also be operated to transfer the cell data to the column decoder for reading the data, resulting in unnecessary power consumption.

When the inner side memory cell array blocks CLA1 and CLA2 are selected, unlike the case where the outer side memory cell array blocks CLA0 and CLA3 are selected, it is not necessary to charge or discharge the bit lines BL0, $\overline{BL0}$ and the bit lines BL3, $\overline{BL3}$ in the nonselected memory cell array blocks CLA0 and CLA3. Therefore, in this case, if the transfer gate transistors Q1, Q3, Q4, . . . is kept off, the power consumption can be reduced. However, as far as the construction shown in FIG. 1, wherein blocks are selected symmetrically in position as seen from the column decoder, is concerned, the maximum power consumption when the memory cell array blocks CLA0 and CLA3 are selected cannot be reduced. In terms of the performance of the memory device, reduction of the maximum power consumption is important.

In conclusion, in the circuit of FIG. 1, charging and discharging of the bit lines is performed for all of the memory cell array blocks in some cases, so there is the problem that a large capacitance of the power supply circuit or heat radiation capacity is required in a system employing the memory device of FIG. 1. For example, in a 256K-bit DRAM, the parasitic capacitance of a bit line in the memory cell array blocks is approximately 0.5 pF. In the case of a cycle time of 200 ns, the current required for charging or discharging the bit lines of all the memory cell array blocks reaches approximately 13 mA ($\approx\{2.5$ (V)$\times 0.5$ (pF/200 (ns)$\}\times\{512\times 4\}$). The current for charging or discharging bit lines constitutes a large portion of the approximately 50 mA total power consumption of the DRAM and reduction of that maximum power consumption would be very effective to reduce the maximum power consumption of the DRAM as a whole.

Figure 2:
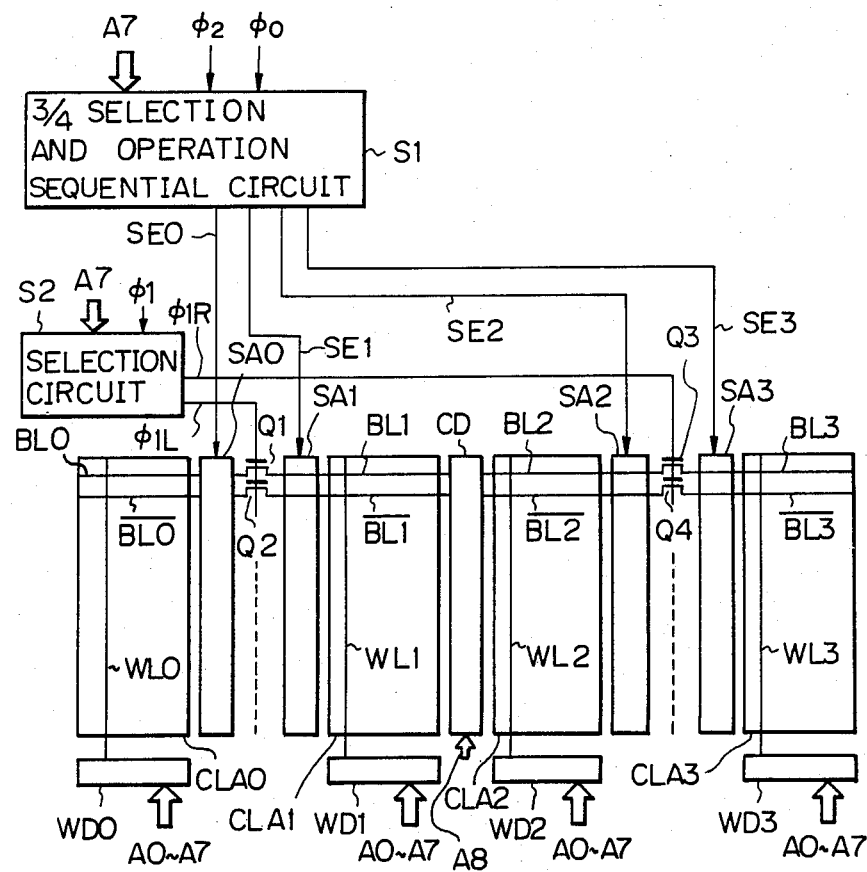
FIG. 2 is a block circuit diagram of a DRAM according to one embodiment of the present invention.

FIG. 2 is a block circuit diagram illustrating a 256K-bit DRAM according to an embodiment of the present invention. In the figure, CLA0 to CLA3 are memory cell array blocks, CD a column decoder, WD0 to WD3 word decoders, SA0 to SA3 sense amplifiers, and Q1 to Q4 transfer gate transistors. These are the same as in the circuit of FIG. 1. The difference with FIG. 1 is that, in FIG. 2, the left side word decoder WD0 and the right side word decoder WD2 with respect to the column decoder CD are always selected simultaneously, i.e., seen from the column decoder CD, the selected memory cell array block on the left side and the selected memory cell array block on the right side are asymmetrically positioned, that is, the distance between the selected memory cell array block on the left side and the column decoder is different from the distance between the selected memory cell array block on the right side and the column decoder. Also, instead of the sequential circuit S0 of FIG. 1, a ¾ selection and operation sequential circuit S1 is provided and only the necessary sense amplifier driven. Further, a selection circuit S2 is provided and the transfer gates to the left and right of the column decoder CD are made independently controllable in operation and just the necessary transfer gate transistors made to be turned on.

For example, assume the memory cell array blocks CLA0 and CLA2 are selected. At this time, the second-most significant bit A7 having the value of the input address signals A0 to A8 is "0". At the illustrated left side of the column decoder CD, a potential difference is created between the bit lines BL0, $\overline{BL0}$ by the memory operation. The ¾ selection and the operation sequential circuit S1 responds to the "0" of the bit A7 and the clock signal $\phi 0$ to raise the sense amplifier enable signal SE0. By this, the sense amplifier SA0 is activated to amplify the potential difference between the bit lines BL0, $\overline{BL0}$. Next, the selection circuit S2 responds to the "0" of the above-mentioned bit A7 and the clock signal $\phi 1$ to make the clock signal $\phi 1L$ the high level (H), whereby the transfer gate transistors Q1, Q2 in between the sense amplifiers SA0 and SA1 are turned on, and the potentials of the bit lines BL0, $\overline{BL0}$ are transferred to the bit lines BL1, $\overline{BL1}$. Then, the sense amplifier enable signal SE1 may advantageously be raised to activate the sense amplifier SA1 which promotes the potential difference between the bit lines BL1 and $\overline{BL1}$, though the sense amplifier SA0 alone is capable of developing the potential difference between the bit lines BL1 and $\overline{BL1}$. The column decoder CD transfers the transferred potential to the I/O gate therein, whereby reading is performed.

On the other hand, on the illustrated right side of the column decoder CD, the potential difference between the bit lines BL2, $\overline{BL2}$ is amplified by the sense amplifier SA2. The amplified potential difference is transferred through the I/O gate in the column decoder CD to the data bus pair (not shown) led to the outside of the memory cell array area. The sense amplifier SA2 is activated by the sense amplifier enable signal SE2. This signal SE2 becomes high level in response to a clock signal $\phi 0$ input to the ¾ selection and operation sequential circuit S1 and the above-mentioned second-most significant bit A7 having the value of "0". When A7 is "0", the ¾ selection and operation sequential circuit S1 fixes the sense amplifier enable signal SE3 at the low level (L). Therefore, the sense amplifier SA3 does not operate. Further, when A7 is "0", the selection circuit S2 fixed the clock signal $\phi 1R$ at the low level. Therefore, the transfer gate transistors Q3, Q4 is between the sense amplifiers SA2 and SA3 do not turn on and the bit lines BL2, BL3 and $\overline{BL2}$, $\overline{BL3}$ remain disconnected. Therefore, no charging or discharging of the bit lines BL3 and $\overline{BL3}$ occur throughout the above operation.

When the memory cell array blocks CLA0 and CLS2 are selected in this way, just the bit lines BL0, BL1, BL2, $\overline{BL0}$, $\overline{BL1}$, and $\overline{BL2}$ are charged or discharged. The bit lines BL3, $\overline{BL3}$ are not charged or discharged. Therefore, the power consumed for the charging or discharging of the bit lines in the circuit shown in FIG. 2 can be kept to ¾ of the maximum power consumption in the circuit shown in FIG. 1.

When the bit A7 is fixed to "1" and the clock signal $\phi 1L$ and sense amplifier enable signal SE0 are fixed to the low level, the memory cell array blocks CLA1 and CLA3 are selected. Therefore, as mentioned above, the power consumed for charging or discharging of the bit lines which occurs at memory cell array blocks CLA1, CLA2, and CLA3 is ¾ the maximum power consumption in the circuit shown in FIG. 1.

Figure 3A:
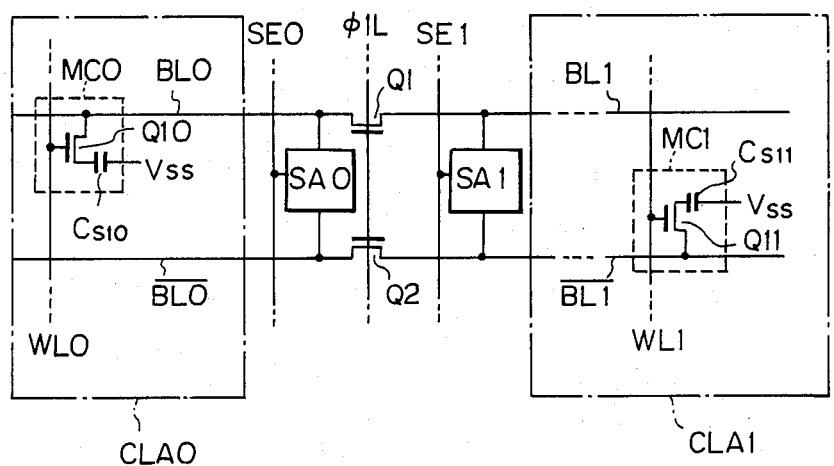
FIGS. 3A and 3B are circuit diagrams of parts of the construction of the circuit of FIG. 2.
Figure 3B:
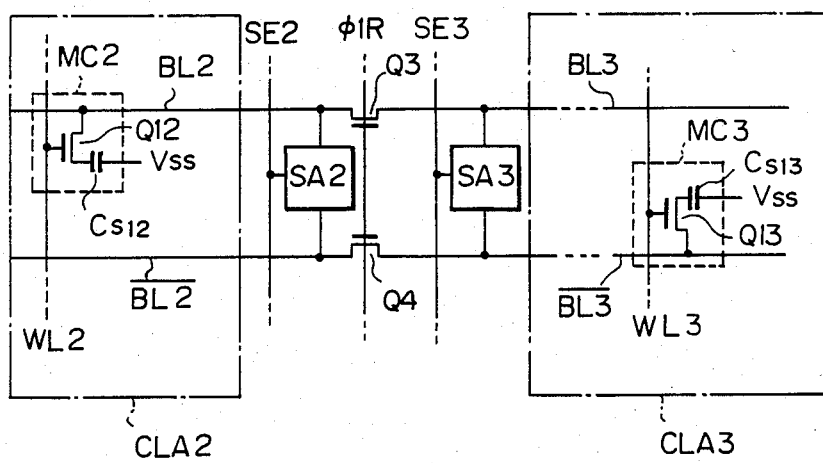

FIGS. 3A and 3B are circuit diagrams of parts of the construction of the circuit of FIG. 2. In FIG. 3A, the portion of the illustrated left side of the column decoder CD of FIG. 2 is shown. The bit lines BL0 and BL1 and the bit lines $\overline{BL0}$ and $\overline{BL1}$ folded back at the column decoder CD are connected by the transistors Q1 and Q2, respectively. Between the split bit lines BL0 and $\overline{BL0}$ is connected a sense amplifier SA0. Between the other split bit lines BL1 and $\overline{BL1}$ is connected a sense amplifier SA1.

The sense amplifiers SA0 and SA1 may be of the type employing a cross-coupled transistor pair with a common source connected to a sense amplifier enable transistor controlled by the sense amplifier enable signal, such as SE0 or SE1. Unlike this embodiment, the sense amplifier enable transistor may be provided commonly for all the cross-coupled transistor pairs in the same memory cell array CLA0 or CLA1. In this case, each of the sense amplifiers SA0 and SA1 is comprised of just a cross-coupled transistor pair. In addition, the lines indicated by reference symbols SE0 and SE1 in FIG. 3A should be construed to be the output lines of the common sense amplifier enable transistors and, accordingly, provide inverted signals of the sense amplifier enable signals SE0 and SE1, in contrast to the following embodiment.

Between the split bit lines BL0 and $\overline{BL0}$ and the word line WL0 are connected memory cells, for example, MC0, for construction of the memory cell array block CLA0̸. Further, between the split bit lines BL1 and $\overline{BL1}$ and the word line WL1 are connected memory cells, for example, MC1, for construction of the memory cell array block CLA1.

The construction of the portion of the illustrated right side of the column decoder CD is similar to that of FIG. 3A, as shown by FIG. 3B.

Figure 4A:
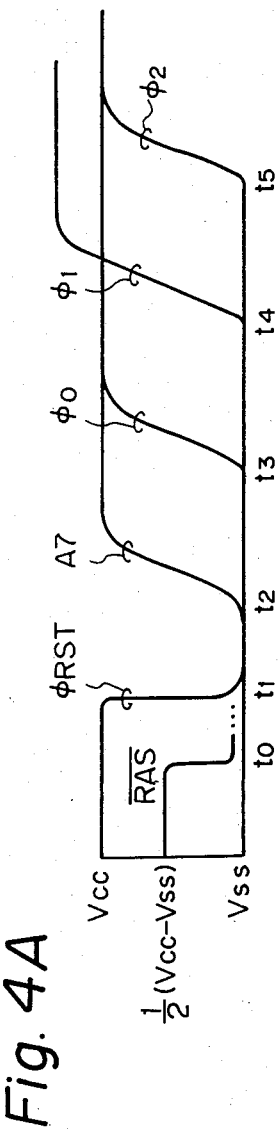
FIGS. 4A through 4C are waveform diagrams for explaining the operation of the circuit of FIG. 2 and FIG. 3.
Figure 4B:
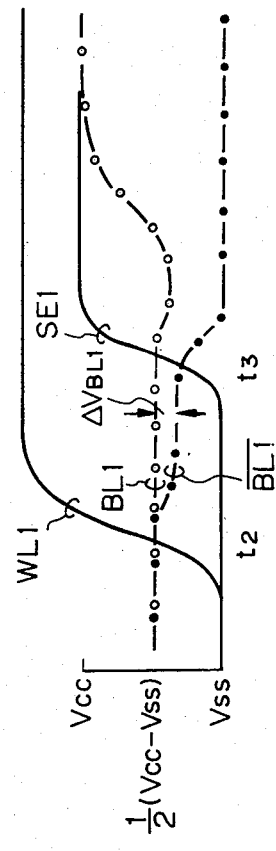
Figure 4C:
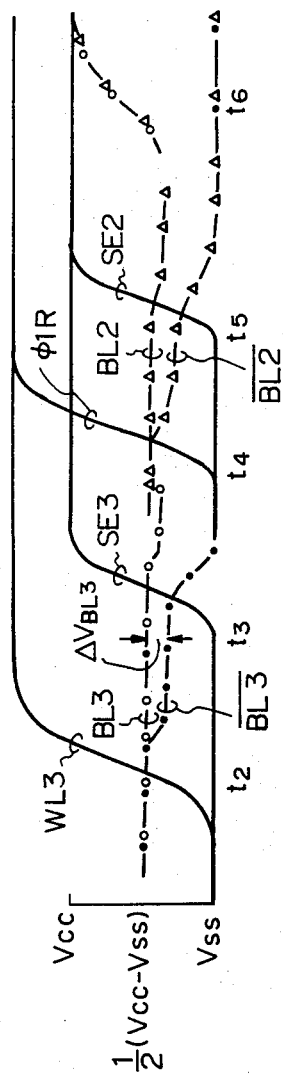

Referring to FIGS. 4A to 4C, the operation of the circuit of FIG. 2 and FIGS. 3A and 3B will be explained.

The DRAM shown in FIG. 2 is activated by a fall of a row address strobe $\overline{RAS}$. As shown in FIG. 4A, the row address strobe $\overline{RAS}$ of the transistor-transistor-logic (TTL) level falls at a time $t_0$. At a time $t_1$ a predetermined time after the time $t_0$, a reset signal $\phi_{RST}$, which is the high level $V_{CC}$, during a reset period of the DRAM, falls to the low level $V_{SS}$. Then, row address signals $A_0$ through $A_8$ are incorporated into the DRAM, so that the bit A7, for example, rises to the high level $V_{CC}$ at a time $t_2$. After this, the clock signals $\phi 0$, $\phi 1$, and $\phi 2$ sequentially rise at times $t_3$, $t_4$, and $t_5$, respectively.

For example, on the illustrated left side of the column decoder CD, assume the word line WL1 connected to the memory cell MC1 of the memory cell array block CLA1 is selected in accordance with the row address signals A0 to A7. If so, as shown in FIG. 4A, the potential of the word line WL1 rises at time $t_2$ and the transistor Q11 of the memory cell MC1 turns on. At this time, if, for example, the data "0" is stored in the memory cell MC1, the potential of the bit line $\overline{BL1}$ falls by the potential difference $\Delta V_{BL1}$, determined by the capacitance ratio of the capacitance of the split bit line $\overline{BL1}$ and the memory cell capacitance $C_{S11}$. On the other hand, the potential of the bit line BL1 remains at the intermediate level of $(V_{CC}-V_{SS})/2$. At time $t_3$, the sense amplifier enable signal SE1 rises in response to the rise of the clock signal $\phi_0$, whereby the sense amplifier SA1 becomes activated and the potential difference of the split bit lines BL1 and $\overline{BL1}$ is increased. The clock signal $\phi_{1L}$ does not rise, so that the transfer gate transistors Q1 and Q2 remain off. Further, the sense amplifier enable signal SE0 also does not rise, so the sense amplifier SA0 is not activated. Therefore, on the illustrated left side of the column decoder CD, no charging or discharging of the bit lines BL0 and $\overline{BL0}$ takes place.

Simultaneously with the selection of the memory cell array block CLA1, the memory cell array block CLA3 at the llustrated right side of the column decoder CD is selected. At the illustrated right side of the column decoder CD, in this case, as shown in FIG. 4C, the potential of the word line WL3 rises at the time $t_2$ in accordance with the row address signals A0 to A7 and the transistor Q13 of the memory cell MC3 turns on. At this time, if, for example, the data "0" is stored in the memory cell MC3, the potential of the bit line BL3 falls by the potential difference $\Delta V_{BL3}$, determined by the capacitance ratio of the capacitance of the split bit line $\overline{BL3}$ and the memory cell capacitance $C_{S13}$. On the other hand, the potential of the bit line BL3 remains at the intermediate level of $(V_{CC}-V_{SS})/2$. At time $t_3$, the sense amplifier enable signal SE3 rises in response to the rise of the clock signal $\phi_0$, whereby the sense amplifier SA3 becomes activated and the potential difference of the split bit lines BL3 and $\overline{BL3}$ is increased. Subsequent to this, at the time $t_2$, the clock signal $\phi_{1R}$ is raised in response to the rise of the clock signal $\phi_1$ and transistors Q3 and Q4 which constitute a transfer gate turn on. By this, the potential from the split bit lines BL3 and $\overline{BL3}$ is transferred to the other split bit lines BL2 and $\overline{BL2}$ and, at time $t_5$, the sense amplifier enable signal SE2 is raised in response to the rise of the clock signal $\phi_2$ and the sense amplifier SA2 is activated. By this, the potential difference of the split bit lines BL2 and $\overline{BL2}$ is further increased, the potential of the split bit line BL2 becomes about the intermediate level, and the potential of the split bit line $\overline{BL2}$ becomes about the low voltage power $V_{SS}$. Next, at time $t_6$, an active pullup circuit (not shown) operates and the potential of the split bit line BL2 and, thus, the split bit line BL3, is raised up to the high voltage power level $V_{CC}$.

The column decoder CD selects, in response to the most significant bit A8, one of the bit line pair BL1, $\overline{BL1}$ and bit line pair BL2, $\overline{BL2}$ and delivers the readout data to the data bus through the I/O gate (not shown).

Figure 5:
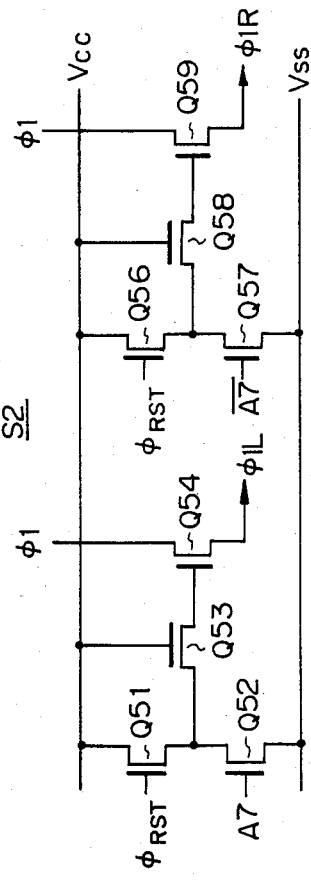
FIG. 5 is a circuit diagram showing one example of the selection circuit in the circuit of FIG. 2.

FIG. 5 is a circuit diagram showing one example of the selection circuit S2 in the circuit of FIG. 2. In the figure, $\overline{A7}$ is the inverted signal of the bit A7. In an actual memory circuit, both such normal and inverted address signals are generated inside the device for the purpose of decoding on the basis of the external address signals latched at the falling edge of the address strobe signal. It should be noted that all of the internal address signals A0 to A8 and inverted address signals A0 to A8 are at the low level "L" during the reset period and after commencement of an active period defined by the row address strobe signal $\overline{RAS}$, either one of the normal and inverted address signal pairs A0 and $\overline{A0}$, A1 and $\overline{A1}$, . . . become the "1" level, i.e., high level in accordance with the acquired external address signals a0 to a8.

FIGS. 6A through 6D are circuit diagrams showing an example of $\frac{3}{4}$ selection an operation sequential circuit S1 in the circuit of FIG. 2. FIGS. 6A through 6D show, respectively, circuits for generating the sense amplifier enable signals SE0, SE1, SE2, and SE3. The operation of these circuits is similar to that of FIG. 5 and, accordingly, only briefly explained hereinafter.

In FIG. 6A, by the high level of the reset signal $\phi_{RST}$ during the reset period of the DRAM, the transistor Q610 turns on, so that the power supply voltage $V_{CC}$ is applied to the gate of the transistor Q640 via the transistors Q610 and Q630, to turn the transistor Q640 on. The transistor Q620 is kept nonconductive due to the "0" of the bit A7. Then, the clock signal $\phi_0$ passes through the transistor Q640 and is obtained as the sense amplifier enable signal SE0. The effect of the reset signal $\phi_{RST}$ is the same in FIGS. 6A through 6D. The reset signal $\phi_{RST}$ becomes "1" during the reset of the DRAM and precharges the gate of the transistor Q640 by being applied to the gate of the transistor Q610.

In FIG. 6B, when the bit A7 is "0", the transistor A651 turns on via the transistors Q671 and Q661. The clock signal $\phi_2$ passes through the transistor Q651 and is obtained as the sense amplifier enable signal SE1. When the bit $\overline{A7}$ is "0", the transistor Q641 turns on via the transistors Q611 and Q631 and the clock signal $\phi_0$ is obtained as the sense amplifier enable signal SE1.

FIG. 6C is similar to FIG. 6B. When the bit A7 is "0", the clock signal $\phi_0$ passes through the transistor Q642 and becomes the sense amplifier enable signal SE2. When the bit $\overline{A7}$ is "0", the clock signal $\phi_2$ passes through the transistor Q652 and becomes the sense amplifier enable signal SE2.

FIG. 6D is similar to FIG. 6A. When the bit $\overline{A7}$ is "0", the clock signal $\phi_0$ passes through the transistor Q643 and becomes the sense amplifier enable signal SE3.

Figure 7:
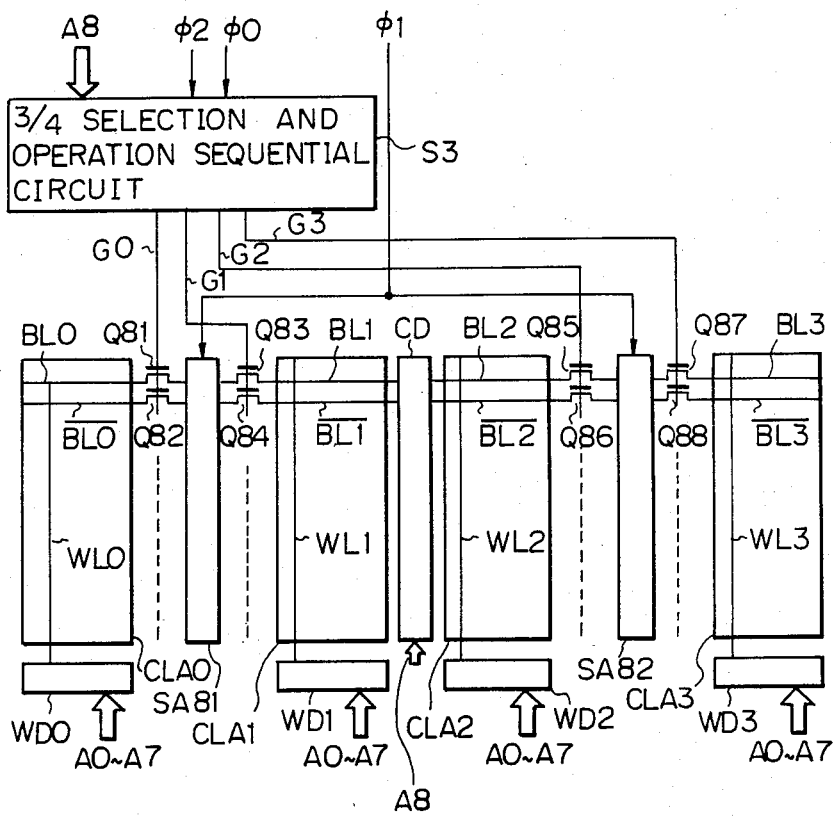
FIG. 7 is a circuit diagram of a DRAM according to another embodiment of the present invention.

FIG. 7 is a block circuit diagram showing a DRAM according to another embodiment of the present invention. In the figure, differing from FIG. 2, the memory cell array blocks CLA0 and CLA1 are provided between them with a single row of sense amplifiers SA81 instead of the two rows of sense amplifiers SA0 and SA1. The memory cell array blocks CLA2 and CLA3 are also provided between them with a single row of sense amplifiers SA82 instead of the two rows of sense amplifiers SA2 and SA3. The memory cell array block CLA0 and sense amplifiers SA81 are provided between them with transfer gate transistors Q81 and Q82. The sense amplifier SA81 and the memory cell array block CLA1 are provided between them with transfer gate transistors Q83 and Q84. The memory cell array block CLA2 and the sense amplifiers SA82 are provided between them with transfer gate transistors Q85 and Q86. The memory cell array block CLA3 and sense amplifiers SA82 are provided between them with transfer gate transistors Q87 and Q88. The sense amplifiers SA81 and SA82 are activated by a single clock signal $\phi_1$. Also, the transfer gate transistors Q81 to Q88 are turned on by the gate enable signals G0 to G3. The gate enable signals G0 to G3 are generated by the $\frac{3}{4}$ selection and operation sequential circuit S3. In other words, when the bit A7 is "0", the gate enable signals G0 and G2 are generated by the clock signal $\phi_0$ so that the transistors Q81, Q82 and Q85, Q86 are turned on. Next, by the clock signal $\phi_2$, the gate enable signal G1 is generated. In this case, the gate enable signal G3 is not generated, so charging or discharging of the bit lines BL3 and $\overline{BL3}$ is not performed.

When the bit $\overline{A7}$ is "0", charging and discharging of the bit lines BL0 and $\overline{BL0}$ are not performed.

The column decoder CD in the circuit shown in FIG. 2 or in FIG. 7 does not have to be a single decoder and may alternatively be two or more. The symmetrical arrangement of the memory cell array blocks with respect to the column decoder is not an essential feature of the present invention.

Figure 8:
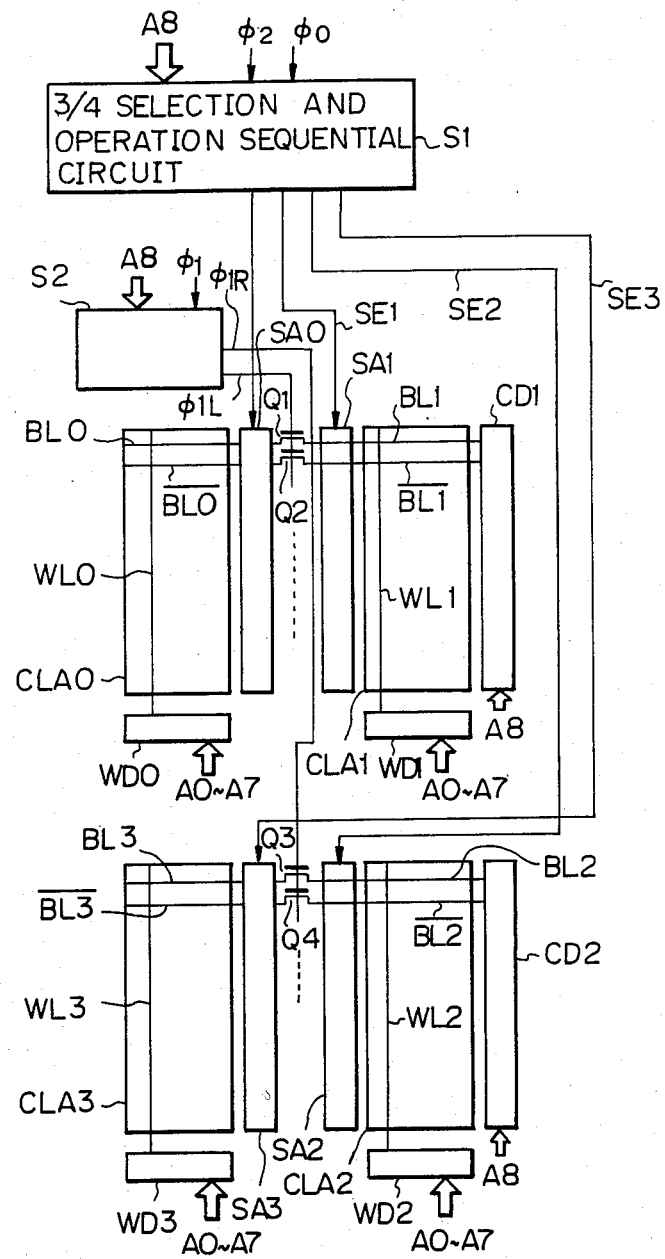
FIG. 8 is a circuit diagram of a DRAM according to still another embodiment of the present invention.

FIG. 8 is a block circuit diagram illustrating a 256K-bit DRAM according to still another embodiment of the present invention. The DRAM shown in FIG. 8 is a modification of the DRAM shown in FIG. 2. In FIG. 8, differing from FIG. 2, two column decoders CD1 and CD2 in place of the single column decoder CD in FIG. 2 are provided. The column decoder CD1 decodes the bit lines BL1 and $\overline{BL1}$ only when the most significant bit A8 of the row address signal is, for example, "0". The column decoder CD2 decodes the bit lines BL2 and $\overline{BL2}$ only when the bit A8 is, for example, "1". The other circuit configuration is quite the same as the circuit shown in FIG. 2.

Figure 9:
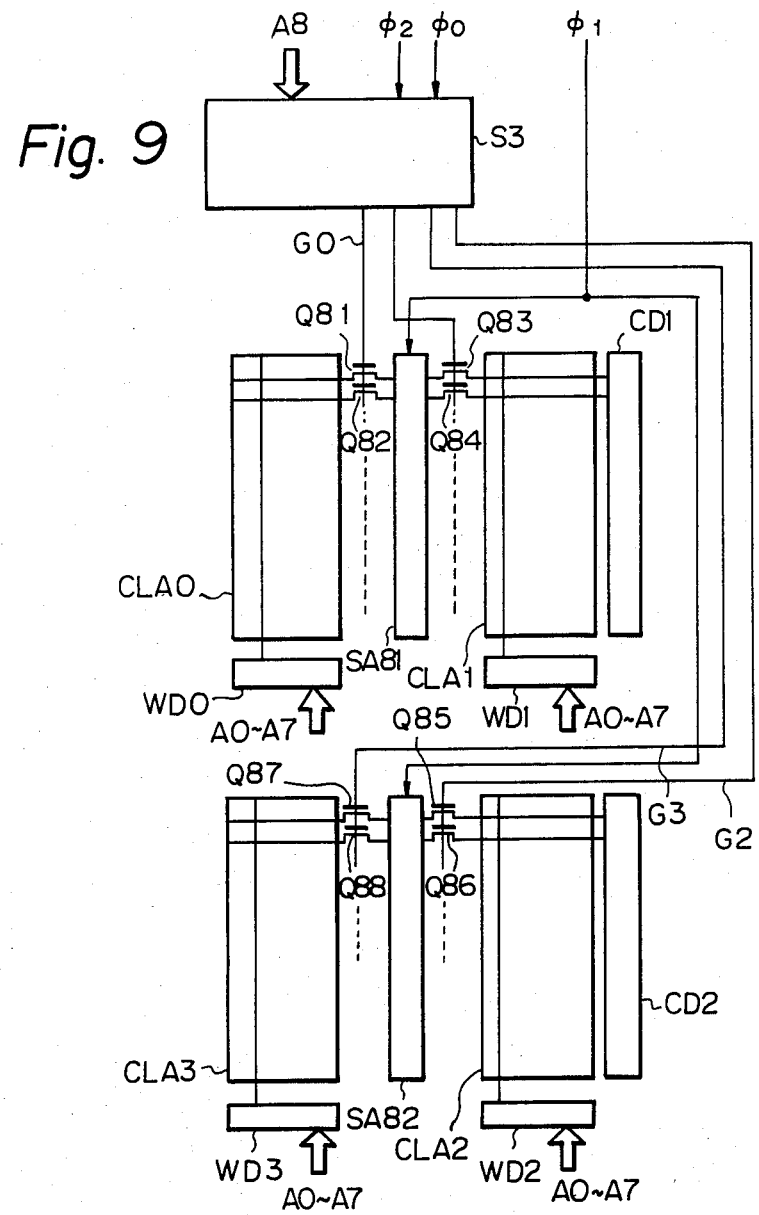
FIG. 9 is a circuit diagram of a DRAM according to still another embodiment of the present invention.

FIG. 9 is a block circuit diagram illustrating a 256K-bit DRAM according to a still another embodiment of the present invention. The DRAM shown in FIG. 8 is a modification of the DRAM shown in FIG. 7. In FIG. 9, differing from FIG. 7, two column decoders CD1 and CD2 are provided. The column decoder CD1 decodes the bit lines BL1 and $\overline{BL1}$ only when the bit A8 is, for example, "0". The column decoder CD2 decodes the bit lines BL2 and $\overline{BL2}$ only when the bit A8 is, for example, "1". The other circuit configuration is quite the same as the circuit shown in FIG. 7.

Throughout the circuits shown in FIGS. 2, 7, 8, and 9, one of the significant features of the embodiments of the present invention resides in that, when the memory cell array block CLA0 which is positioned relatively far from the column decoder is selected in one group of the memory cell array blocks, then the memory cell array block CLA2 which is positioned relatively near the column decoder is selected in another group of the memory cell array blocks.

Also, when the memory cell array block CLA1 which is positioned relatively near the column decoder is selected in one group of the memory cell array blocks, then the memory cell array block CLA3 which is positioned relatively far from the column decoder is selected in another group of the memory cell array blocks. The above-mentioned selection of the memory cell array blocks in the two groups is carried out by means of the ¾ selection and operation sequential circuit S1 and the selection circuit S2 in the circuit shown in FIG. 2 or in FIG. 8 or by means of the ¾ selection and operation sequential circuit S3 in the circuit shown in FIG. 7 or in FIG. 9.

In conclusion, according to the present invention, the distance between the selected memory cell array block in one group and the column decoder is different from the distance between the selected memory cell array block in another group and the column decoder, which enables a part of the memory cell array blocks to remain inactivated throughout an active cycle, whereby the maximum power consumption is reduced.

The above-mentioned embodiments were explained in reference to a DRAM having four memory cell array blocks. However, the present invention is not limited to the same and may be applied to semiconductor memory devices having a larger number of memory cell array blocks.

As is clear from the above explanation, according to the present invention, in a semiconductor memory device with bit lines split into a plurality of blocks and with an improved capacitance ratio between the capacitance of the memory cells to the bit line capacitance, the maximum number of blocks in which charging and discharging of the bit lines are performed is minimized, thereby allowing a considerable reduction in the maximum power consumption compared with the case of FIG. 1, where the selected blocks in two groups are at the same distance from the column decoder, therefore enabling operation with a small capacity power source.

We claim:

1. A semiconductor memory device comprising:
   at least two groups each including a plurality of memory cell array blocks;
   each of said memory cell array blocks including a plurality of bit line pairs, a plurality of word lines, and a plurality of memory cells each being connected between respective ones of said bit line pairs and word lines;
   switching means connected between respective bit line pairs of adjoining pairs of said memory cell array blocks of each said group, for selectively splitting and connecting said respective bit line pairs of said adjoining pairs of memory cell array blocks of the respective group;
   column decoder means operatively connected to the bit line pairs of a first of said memory cell array blocks of each said group, for selecting a bit line pair therefrom to read data from a selected memory cell in the respective group;
   a word decoder for simultaneously selecting one of said word lines in one of said memory cell array blocks in a first one of said groups and one of said word lines in one of said memory cell array blocks in a second of said groups, in such a way that the distance between a first respective part of said column decoder means and the memory cell array block with the respective selected word line of said first group is different from the distance between a second respective part of said column decoder means and the memory cell array block with the selected word line of said second group; and
   a switching control circuit for controlling said switching means so as to selectively connect the bit line pairs of each said memory cell array block having said selected word line that has the greater value of said distance and in another of the memory cell array blocks of the same group that is located between said memory cell array block of said greater value of said distance and said column decoder.

2. A semiconductor memory device as set forth in claim 1, further comprising a plurality of sense amplifiers, each for amplifying the potential difference between the bit line pairs of at least one respective one of said memory cell array blocks, wherein:
   said switching control circuit comprises a sequential circuit;
   said switching means comprises a plurality of groups of transfer gate transistors, each group of said transfer gate transistors being connected along the respective bit line pairs between a respective one of said memory cell array blocks and a respective one of said plurality of sense amplifiers; and said sequential circuit is operatively connected to said transfer gate transistors to control the number of groups of said transfer gate transistors opened by said sequential circuit in said first group of memory cell array blocks to be different from the number of groups of said transfer gate transistors opened by said sequential circuit in said second group of memory cell array blocks.

3. A semiconductor memory device as set forth in claim 1, further comprising a plurality of sense amplifiers, each for amplifying the potential difference between the bit line pairs of at least one respective one of said memory cell array blocks, said switching control circuit comprising a sequential circuit, operatively connected to said sense amplifiers, for controlling said sense amplifiers in such a way that the number of activated sense amplifiers in said first group is different from the number of activated sense amplifiers in said second group.

4. The device of claim 3, comprising one of said plurality of sense amplifiers for each of said memory cell array blocks, said switching means having respective parts connected along the respective bit line pairs in between the two pluralities of sense amplifiers of the respective adjoining pair of memory cell array blocks of each said group, and said switching control circuit including a selection circuit for alternately operating said respective parts of said switching means in said two groups.

5. The device of claim 3, comprising one of said pluralities of sense amplifiers for each said memory cell array block, wherein said switching means has a respective part connected along the respective bit lines between the respective two pluralities of sense amplifiers of each adjoining pair of said memory cell array blocks.

6. A semiconductor memory device as set forth in claim 3, wherein said switching means comprises a plurality of pairs of transfer gate transistors, each group of said transfer gate transistors being connected between respective ones of said bit line pairs of said adjoining pairs of memory cell array blocks.

7. A semiconductor memory device as set forth in claim 6, wherein said switching control circuit further comprises a selection circuit operatively connected to said plurality of groups of transfer gate transistors, for controlling each said group of transfer gate transistors in such a way that the number of groups of said transfer gate transistors opened by said selection circuit in said first group of memory cell array blocks is different from the number of groups of said transfer gate transistors opened by said selection circuit in said second group of memory cell array blocks.

8. The device of claim 3, comprising one of said pluralities of sensing amplifiers for each adjoining pair of said memory cell array blocks, and a respective part of said switching means for each said memory cell array block, wherein each said plurality of sensing amplifiers is connected along the respective bit line pairs in between the respective pluralities of sensing amplifiers of the respective adjoining pair of memory cell array blocks.

9. The device of claim 8, said column decoder means comprising two column decoders, one for each said group, each said column decoder being connected to the bit line pairs of a respective one of the memory cell array blocks.

10. The device of claim 3, said switching means including a respective part corresponding to each said memory cell array block, wherein there is one of said pluralities of sense amplifiers for each adjoining pair of said memory cell array blocks, and wherein each said plurality of sense amplifiers is located along the respective bit line pairs in between the respective parts of said switching means of respective adjoining pairs of said memory cell array blocks.

11. The device of claim 10, wherein respective pairs of said pluralities of sense amplifiers, one plurality each from said two groups, are simultaneously enabled during said selecting of said word lines of said one memory cell array block in each of said first and second groups.

12. The device of claim 11, said column decoder means comprising two column decoders, one for each said group, each said column decoder being connected to the bit line pairs of a respective one of the memory cell array blocks.

13. The device of claim 11, wherein said switching control circuit includes a selection circuit to alternately operate a respective part of said switching means in said two groups.

* * * * *